United States Patent
Vig et al.

(10) Patent No.: US 6,919,720 B2
(45) Date of Patent: Jul. 19, 2005

(54) PEAK-TO-PEAK SIGNAL DETECTOR

(75) Inventors: Ravi Vig, Bow, NH (US); Jay M. Towne, Newbury, NH (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 178 days.

(21) Appl. No.: 10/347,902

(22) Filed: Jan. 21, 2003

(65) Prior Publication Data

US 2003/0160696 A1 Aug. 28, 2003

Related U.S. Application Data

(60) Provisional application No. 60/354,907, filed on Feb. 5, 2002.

(51) Int. Cl.[7] ............................................. G01R 33/00
(52) U.S. Cl. .................. 324/260; 324/207.11; 324/251
(58) Field of Search ................. 324/207.11, 207.12, 324/207.2, 207.21, 207.25, 173, 225, 260–262, 244, 251; 338/32 H, 32 R; 327/510, 511

(56) References Cited

U.S. PATENT DOCUMENTS

| | | |
|---|---|---|
| 4,001,604 A | 1/1977 | Parks et al. |
| 4,420,742 A | 12/1983 | Tadauchi et al. |
| 4,560,940 A | 12/1985 | van der Schans |
| 4,564,804 A | 1/1986 | Wilke et al. |
| 4,843,307 A | 6/1989 | Ichijyo |
| 4,990,912 A | 2/1991 | Selwa |
| 5,404,054 A | 4/1995 | Kotowski |
| 5,694,038 A | 12/1997 | Moody et al. |
| 5,729,127 A | 3/1998 | Tamura et al. |
| 6,208,173 B1 | 3/2001 | Redman-White |
| 6,242,908 B1 | 6/2001 | Scheller et al. |
| 6,297,627 B1 * | 10/2001 | Towne et al. .......... 324/207.12 |

FOREIGN PATENT DOCUMENTS

| | | |
|---|---|---|
| DE | 100 04 080 C1 | 9/2001 |
| EP | 0 642 029 B1 | 8/2000 |

OTHER PUBLICATIONS

International Search Report International Application No. PCT/US 03/01679 dated Oct. 13, 2003.

* cited by examiner

*Primary Examiner*—Bot LeDynh
(74) *Attorney, Agent, or Firm*—Daly, Crowley, Mofford & Durkee, LLP

(57) ABSTRACT

A detector to determine the peak-to-peak value of a signal is presented. The detector includes a first circuit to provide a tracking signal that tracks a positive slope of the signal during a first time interval and a negative slope of the signal during a second time interval. The detector further includes a second circuit configured to produce values associated with the tracking signal provided during one of the first and second time intervals, where one of the values is indicative of the peak-to-peak value of the signal.

12 Claims, 10 Drawing Sheets

PEAK-TO-PEAK SIGNAL DETECTOR

CROSS-REFERENCE TO RELATED APPLICATIONS

This application claims the benefit of U.S. Provisional Patent Application Ser. No. 60/354,907 entitled "Peak-to-Peak Signal Detector," filed Feb. 5, 2002, which is incorporated herein by reference in its entirety for all purposes.

STATEMENT REGARDING FEDERALLY SPONSORED RESEARCH

Not applicable.

FIELD OF THE INVENTION

This invention relates generally to peak-to-peak signal detection.

BACKGROUND OF THE INVENTION

It is often desirable to measure the peak-to-peak value of a time-varying analog signal. One way to measure the peak-to-peak value is to use two digital-to-analog converters (DACs) to capture the positive and negative peaks of the signal. The negative peak DAC output is subtracted from the positive signal DAC output to provide a measure of the peak-to-peak voltage of the signal.

One application for such a peak-to-peak signal detector is in magnetic field sensing circuits, such as a gear tooth sensor which provides an output signal that changes state upon the approach or retreat of each tooth of a rotating ferrous gear. In such circuits, a magnetic field-to-voltage transducer, such as a Hall effect device or magnetoresistive device, is used to generate a signal proportional to the strength of the magnetic field caused by the ferrous gear. It is sometimes desirable to measure the peak-to-peak voltage of the magnetic field signal, such as for the purpose of enabling a comparator once the peak-to-peak signal has reached a predetermined minimum value.

SUMMARY OF THE INVENTION

In one aspect of the invention, a detector for determining the peak-to-peak value of a signal includes a first circuit to provide a tracking signal that tracks a positive slope of the signal during a first time interval and a negative slope of the signal during a second time interval, and a second circuit configured to produce values associated with the tracking signal provided during one of the first and second time intervals. One of the values is indicative of the peak-to-peak value of the signal.

In another aspect of the invention, a sensor includes a transducer and a peak-to-peak detector. The transducer provides a transducer output signal indicative of a sensed input. The peak-to-peak detector provides a tracking signal which substantially follows the transducer output signal between each peak and valley of a given cycle of the transducer output signal and holds the value of the transducer output signal at the peak and valley until the transducer output signal varies from the held peak and valley by a predetermined amount. The peak-to-peak detector is configurable to provide an output signal that is indicative of the peak-to-peak voltage of the transducer output signal during at least one of a first half and a second half of the given cycle. The sensor further includes logic responsive to the output signal of the peak-to-peak detector to provide a logic signal that indicates if the sensed input exceeds a predetermined threshold level.

The peak-to-peak detection mechanism of the present invention advantageously allows a peak-to-peak value for a time-varying signal to be produced in a flexible, efficient and cost-effective manner.

Other features and advantages of the invention will be apparent from the following detailed description, and from the claims.

BRIEF DESCRIPTION OF THE DRAWINGS

The invention will be more fully understood from the following detailed description taken in conjunction with the accompanying drawings, in which.

DETAILED DESCRIPTION

Figure 1:
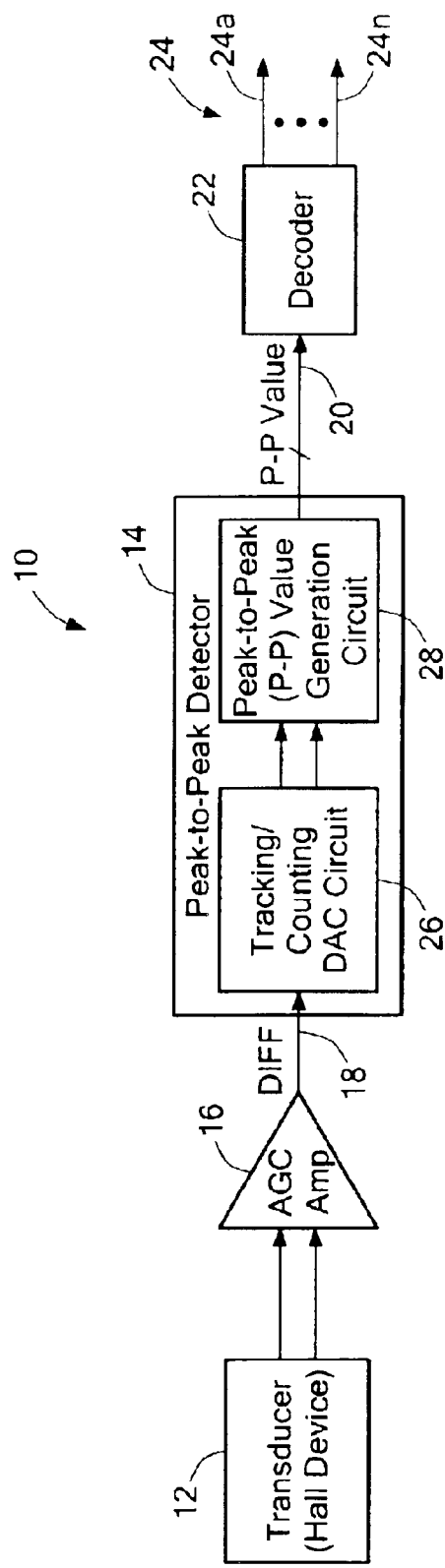
FIG. 1 is a block diagram of a Hall effect sensor that includes a peak-to-peak detector.

Referring to FIG. 1, a circuit 10 includes a transducer 12 that is coupled to a peak-to-peak detector 14 via an amplifier 16. In the illustrated embodiment, the transducer 12 is a magnetic-field-voltage transducer that generates a time-varying, differential output signal in response to an ambient magnetic field. The strength of the transducer output signal is proportional to the magnitude of the ambient magnetic field. The amplifier 16 is shown as an amplifier with automatic gain control (AGC), that is, an AGC amplifier. The transducer output signal is amplified by the amplifier 16 to provide a signal 18 ("DIFF") to the peak-to-peak detector 14. The peak-to-peak detector 14 determines a peak-to-peak value 20 of the DIFF signal 18. The circuit 10 also includes a logic circuit shown as a decoder 22, which receives the peak-to-peak value 20 from the peak-to-peak detector 14 and uses the peak-to-peak value to provide one or more logic signals 24a–24n that indicate if the peak-to-peak DIFF signal 18 has exceeded one or more predetermined values. More particularly, in the illustrative embodiment, as will be described, the logic signals are diagnostic signals indicative of whether or not the magnetic field has exceeded a predetermined Gauss level.

In the illustrated circuit 10, the transducer 12 is in the form of a Hall device. Thus, the illustrative circuit 10 may be referred to as a Hall effect sensor. Other types of magnetic-field-to-voltage transducers, such as magnetoresistive devices, are equally suitable. Further, it will be appreciated by those of ordinary skill in the art that the peak-to-peak signal detector 14 is applicable to other applications for measuring the peak-to-peak value of other types of signals.

The peak-to-peak signal detector 14 includes a first circuit 26, shown as a tracking/counting DAC circuit 26 (hereinafter, circuit 26), and a second circuit 28, shown as a peak-to-peak value generation circuit 24 (hereinafter, circuit 28). The circuit 26 provides a tracking signal that tracks a positive slope of the DIFF signal 18 during a first time interval and a negative slope of the DIFF signal 18 during a second time interval. The circuit 28, responsive to the output of the circuit 26, produces values associated with the tracking signal provided during one of the first and second time intervals, where one of the values is indicative of the peak-to-peak value 20 of the DIFF signal 18.

Figure 2:
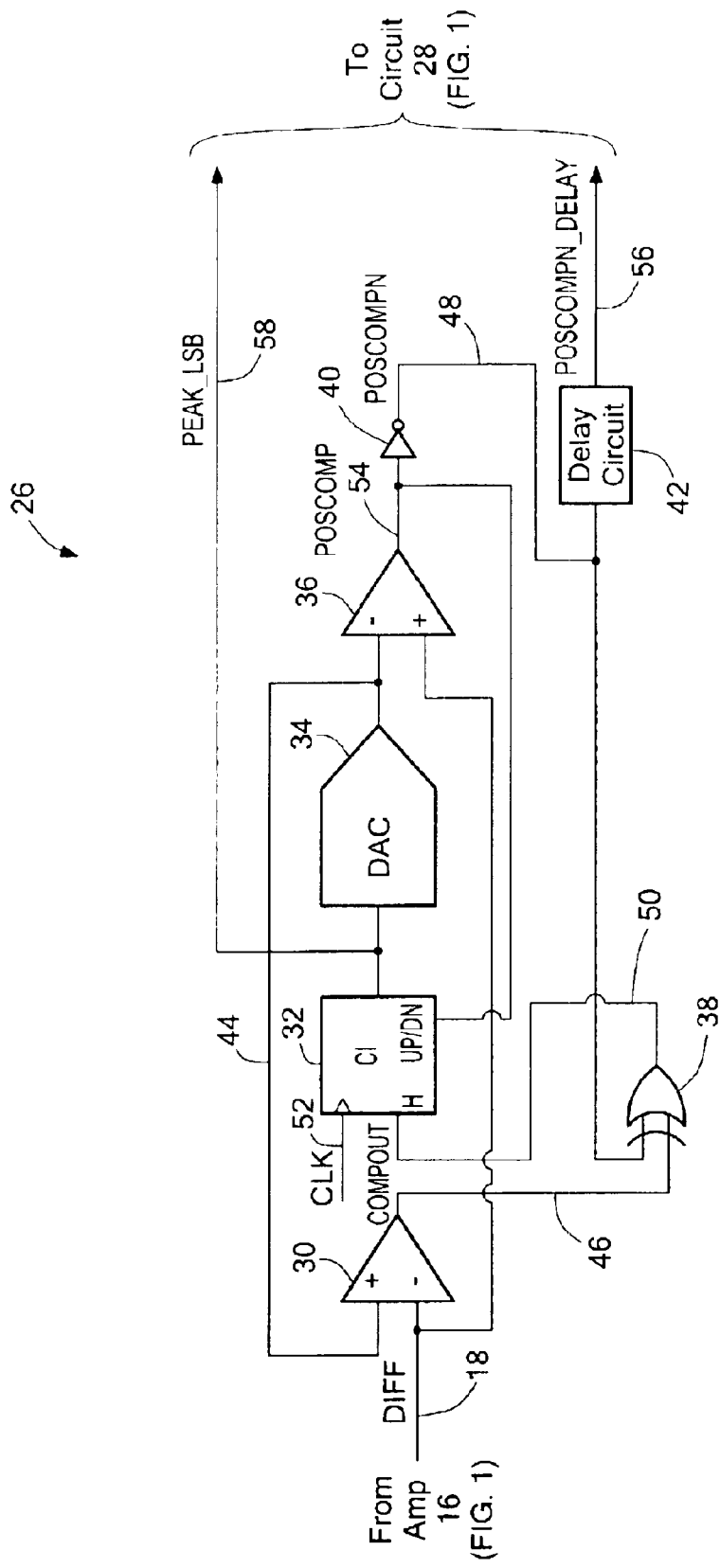
FIG. 2 is a detailed block diagram of an exemplary embodiment of the tracking/counting circuit shown in FIG. 1.

An exemplary embodiment of the circuit 26 is shown in FIG. 2. Referring to FIG. 2, the circuit 26 includes a first comparator 30, an up/down counter ("C1") 32, a DAC 34 and a second comparator 36. Also included is an XOR circuit 38, an inverter 40 and a delay circuit 42. The DIFF signal 18 (from the amplifier 16 of FIG. 1) is coupled to an inverting input of the first comparator 30. The first comparator 30 receives, at the non-inverting input, a DAC output signal 44 of the DAC 34, as shown. The DAC output signal 44 is the tracking signal mentioned above. As will become apparent, the DAC output signal 44 tracks the DIFF signal 18 between its positive and negative peaks, or peaks and valleys, and holds the value of the peaks and valleys until the DIFF signal varies from the held peaks and valleys by a predetermined amount. An output signal of the first comparator 30, indicated as COMPOUT 46, is coupled to the XOR gate 38, which additionally receives a POSCOMPN signal 48 (described below) and provides at its output a HOLD input 50 of the counter 32. Counter 32 is further responsive to a CLK clock signal 52 and to a POSCOMP signal 54 produced by the second comparator 36 for controlling whether the counter 32 counts up or down.

The output of the counter 32 is converted into an analog signal by the DAC 34. The DAC output (or tracking) signal 44 is further provided to the second comparator 36, as shown. The second comparator 36 has hysteresis, here on the order of 100 mV, so that the output signal POSCOMP 54 of comparator 36 changes state when the DIFF signal 18 exceeds the DAC signal 44 by approximately 100 mV. Specifically, and as shown, the POSCOMP signal 54 is inverted by the inverter 40 to produce the POSCOMPN signal 48. Thus, POSCOMPN signal 48 transitions to a logic high level when the DIFF signal 18 is less than the DAC signal 44 by the hysteresis amount and transitions to a logic low level when the DIFF signal 18 exceeds the DAC signal 44 by the hysteresis amount.

For reasons which will be discussed later, the POSCOMPN signal 48 is provided to the delay circuit 42, which delays the signal by some predetermined time delay. The delay circuit 42 can include an RC circuit. The delayed POSCOMPN signal 48, shown as POSCOMPN_DELAY signal 56, is provided to the second circuit 28. Also provided to the second circuit 28 is a PEAK_LSB value 58 taken at the output of the first counter 32. How these two signals are used will be discussed later with reference to FIG. 3.

Figure 3:
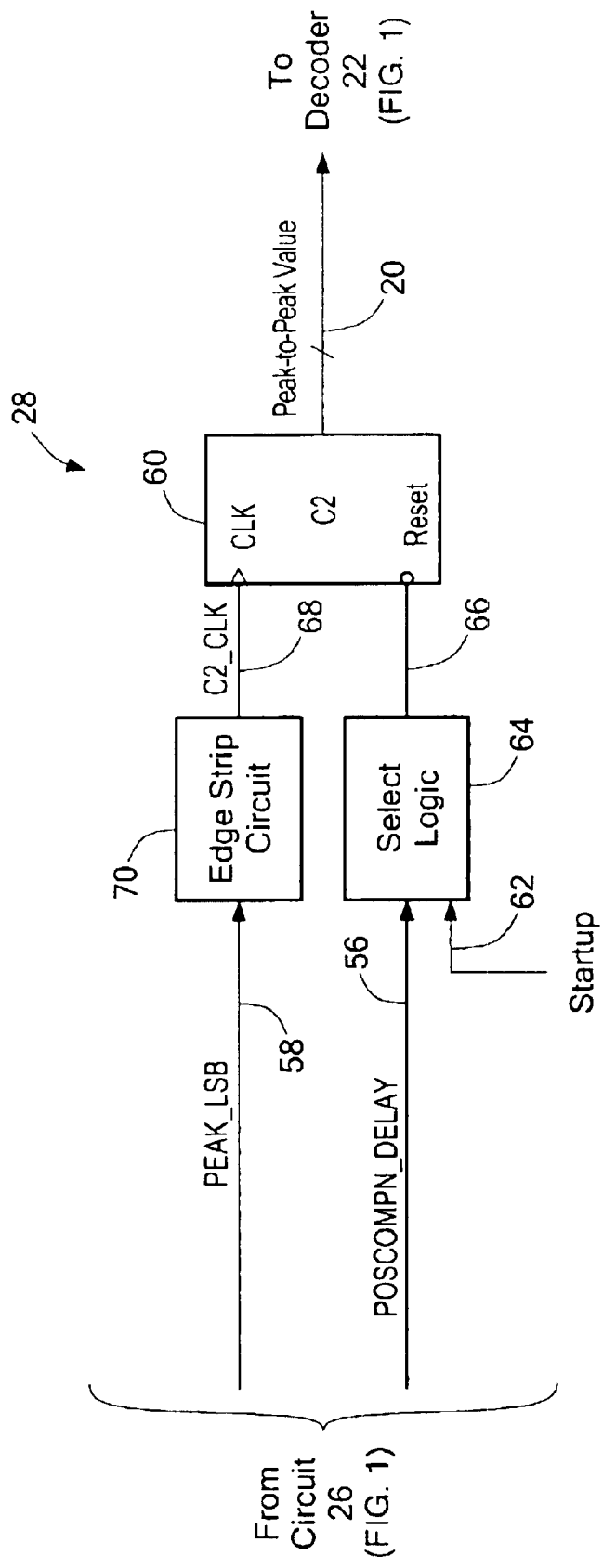
FIG. 3 is a detailed block diagram of an exemplary embodiment of the peak-to-peak value generation circuit shown in FIG. 1.

Now referring to FIG. 3, which shows an exemplary embodiment of the second circuit 28, a second counter 60 is reset in response to a STARTUP signal 62 and the POSCOMPN_DELAY signal 56. More particularly, a select logic circuit 64, which can be implemented as a NOR gate, receiving the STARTUP and POSCOMPN_DELAY signals, provides the reset input, indicated by reference numeral 66, to the second counter 60. The STARTUP signal 62 goes high for approximately 60 μs when power to the circuit 10 is turned on.

The second counter 60 is clocked by a C2_CLK signal 68 which is generated in response to the least significant bit of the output of the first counter 32, that is, the PEAK_LSB signal 58. The second counter 60 provides at its output the peak-to-peak value 20 indicative of the peak-to-peak voltage of the DIFF signal 18. The second counter output signal 20 may be converted into the diagnostic signals 24a–24n by the decoder 22, as will be described in connection with the embodiment of FIGS. 5A–5B. The output of the second counter 60 may be stored for use or transmitted off of the circuit to an external controller.

The edges of the PEAK_LSB signal 58 are stripped by a circuit ("edge strip circuit") 70 to provide the C2_CLK signal 68 so that every step of the first counter 32 causes a step in the second counter 60. This doubles the resolution of the second counter 60. More particularly, the edge strip circuit 70 can include an XOR gate and delay circuit to generate a short pulse in response to each rising and falling edge of the PEAK_LSB signal 58. In this way, each rising and falling edge of the PEAK_LSB signal 58 generates a clock pulse in the second counter 60.

Figure 4:
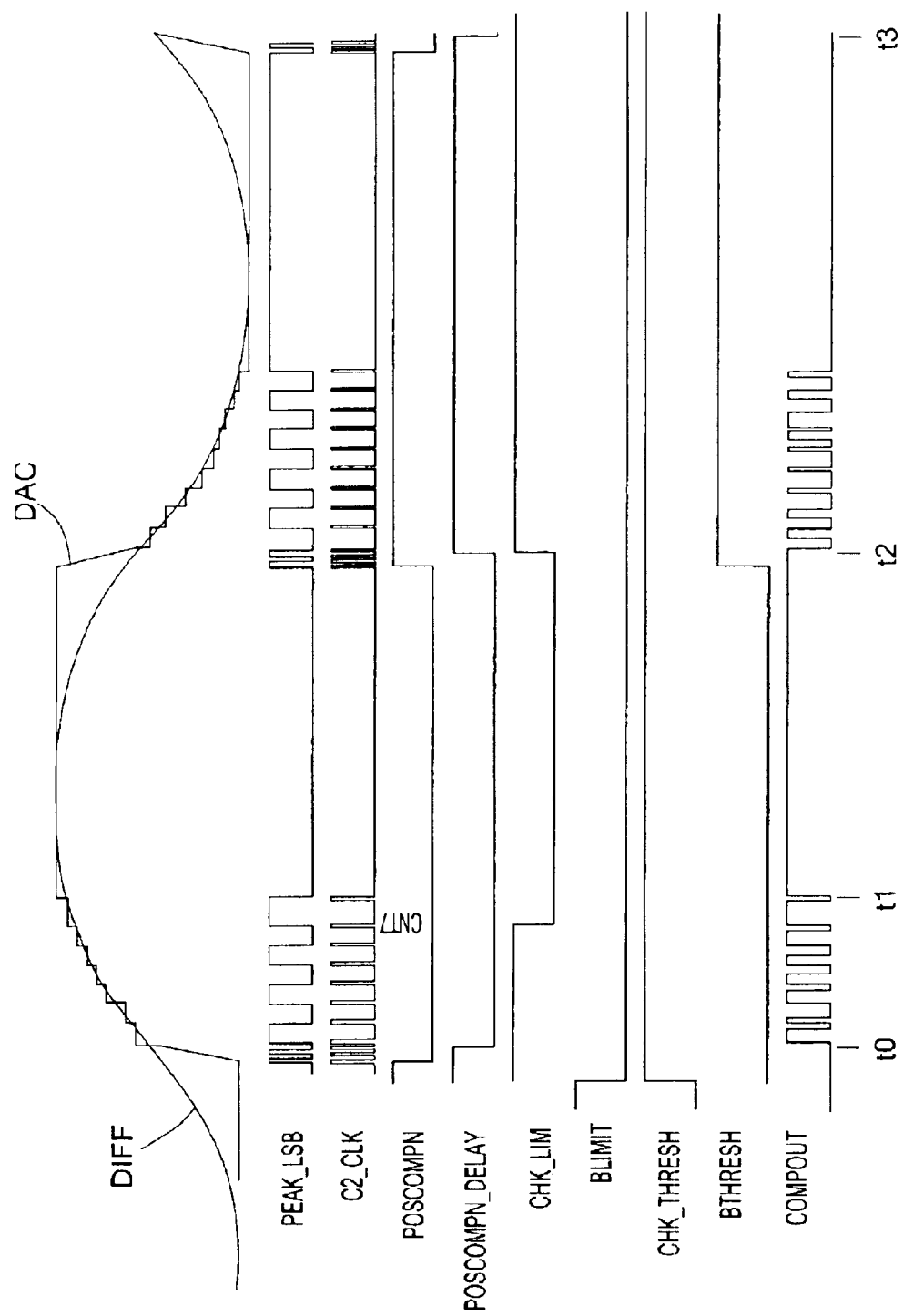
FIG. 4 is a depiction of several signal waveforms associated with the Hall effect sensor shown in FIGS. 1–3.

As is illustrated by the waveforms in FIG. 4, the tracked level of the DIFF signal 18 (i.e., the DAC output signal 44) acquires the DIFF signal 18 at time t=0. After time t=0, whenever the DIFF signal 18 exceeds the DAC output signal 44 by the hysteresis level of the first comparator 30, such as by 10 mV, the COMPOUT signal 46 at the output of the first comparator 30 transitions to a logic low level, thereby causing the first counter 32 to count. Once the first counter 32 counts up one step, the COMPOUT signal 46 goes high and holds the count value until the DIFF signal 18 exceeds the DAC output signal 44 by 10 mV again. When the DIFF signal 18 reaches a positive peak, the DAC output signal 44 stays above the DIFF signal 18 and keeps the HOLD input 50 to the first counter 32 asserted until the hysteresis of the second comparator 36 has been overcome, as occurs when the POSCOMPN signal 48 goes high, just before time t2.

Still referring to FIG. 4, between times t0 and t2, the POSCOMPN_DELAY signal 56 is low and the output signal 66 of the select logic circuit (i.e., the NOR gate) 64 is high, thereby enabling the second counter 60 to count by keeping its reset input high. The DAC 34 holds the positive peak of the DIFF signal 18 (which is reached at time t1) until just before time t2, when the DIFF signal 18 varies from the peak value by the predetermined amount of the hysteresis of the second comparator 36. A logic high transition of the POSCOMPN signal 48 causes the count direction of the first counter 32 to change to the down direction so that the DAC output signal 44 can track the falling portion of the DIFF signal 18.

Additionally, when the POSCOMPN signal 48 is at a logic high, it causes the POSCOMPN_DELAY signal 56 to go high following the delay interval (of the delay circuit 42), thereby causing the reset input to the second counter 60 to be low and preventing the second counter 60 from being clocked for as long as the POSCOMPN signal 48 remains high. With this arrangement, the second counter 60 is reset during a half cycle of the DIFF signal 18 and the reset input is released during the other half cycle, so that the second counter 60 only counts during a selected one of the rising and falling portions of the DIFF signal 18. In the illustrative embodiment, the second counter 60 counts during the rising portions of the DIFF signal 18. It will be appreciated that, alternatively, the second counter 60 may be controlled to count during falling portions of the DIFF signal 18. As a further alternative, the second counter 60 may be controlled to count during rising and falling portions of the DIFF signal 18 in order to give more frequently updated peak-to-peak signal value (i.e., a peak-to-peak value that is updated twice per DIFF signal cycle).

When the POSCOMPN signal 48 goes high, at a short time before time t2 corresponding to the delay between the POSCOMPN and POSCOMPN_DELAY signals, or the delay interval, the DIFF signal 18 has come away from the held positive peak by the predetermined hysteresis amount. At this point, the peak-to-peak value 20 indicative of the peak-to-peak DIFF signal voltage can be measured as a digital word at the output of second counter 60, since that counter counted from time t0 to time t2.

Figure 5A:
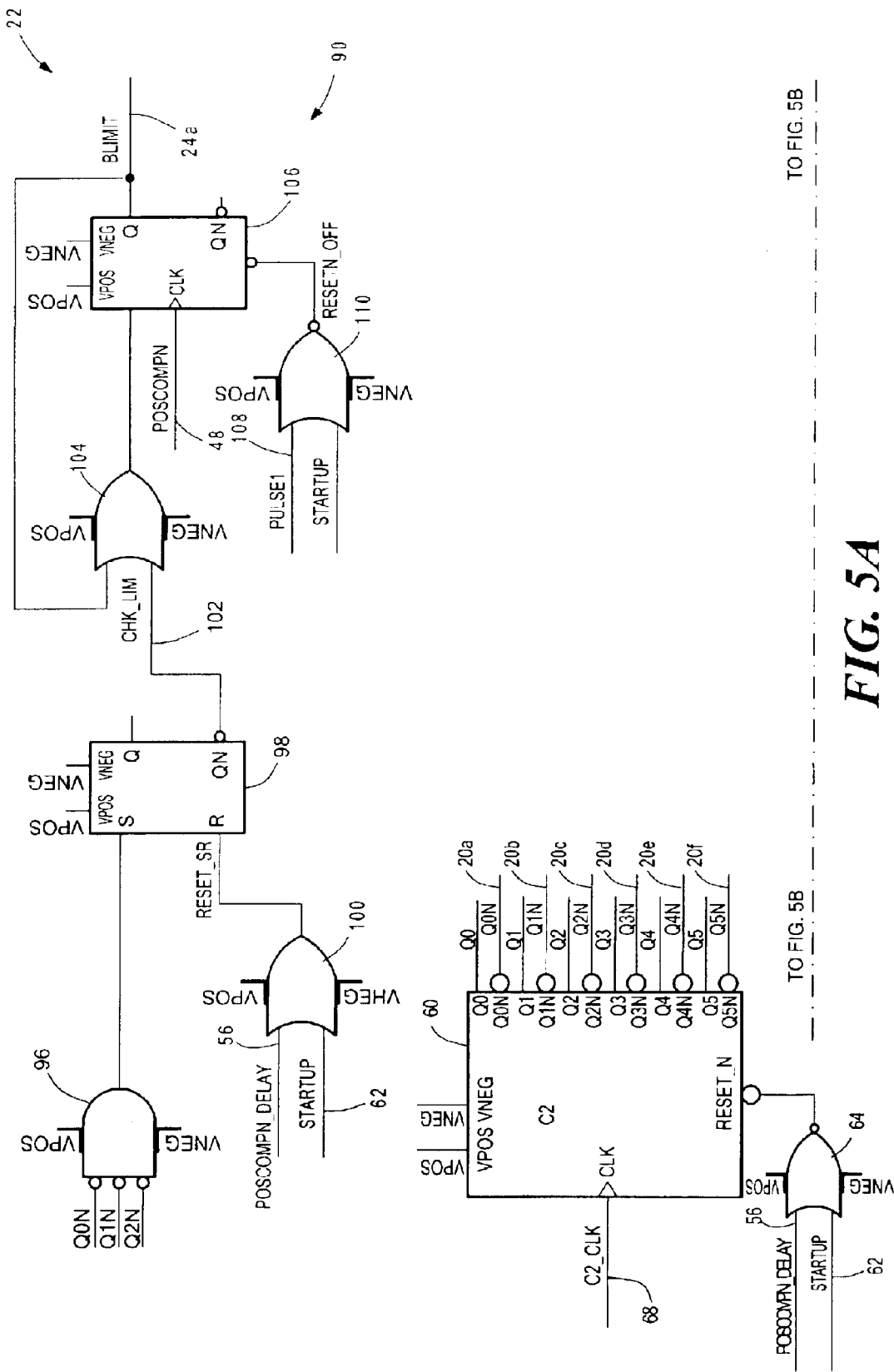
FIGS. 5A–5B are schematic diagrams of a portion of the Hall effect sensor shown in FIGS. 1–3.
Figure 5B:
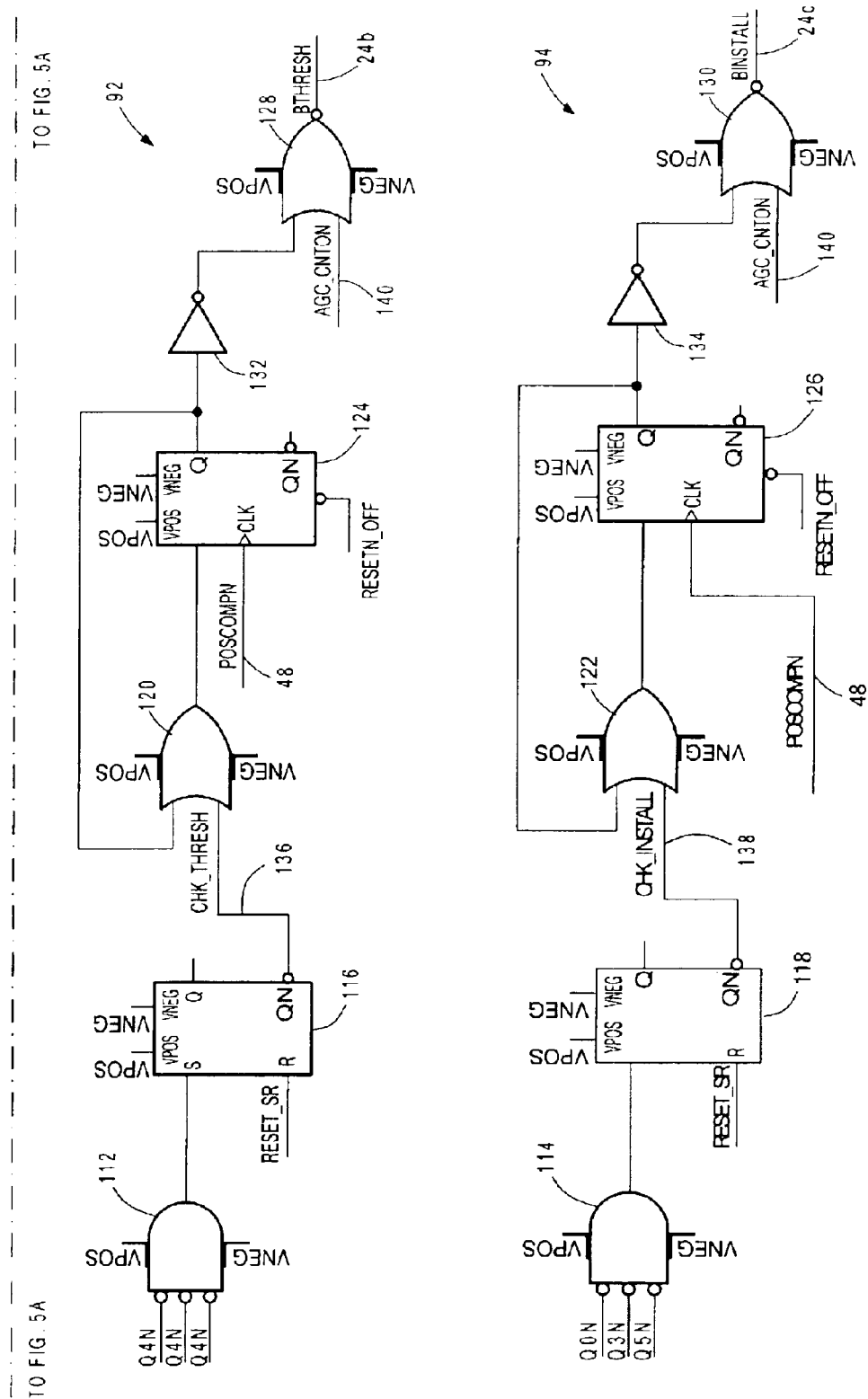

Referring to the detailed schematics of FIGS. 5A–5B, a portion of the circuit 10 of FIG. 1 is shown to include the second counter 60 and the decoder 22. The second counter 60, as discussed earlier with reference to FIG. 3, is reset by the output of the NOR gate 64, which is responsive to the POSCOMPN_DELAY signal 56 and to the STARTUP signal 62. The second counter 60 provides to the decoder 22 the following output signals: Q0N signal 20a, Q1N signal 20b, Q2N signal 20c, Q3N signal 20d, Q4N signal 20e and Q5N signal 20f. In the illustrative embodiment, the decoder 22 generates the signals 24a, 24b, 24c, shown here as diagnostic signals, the BLIMIT signal 24a, the BTHRESH signal 24b, and the BINSTALL 24c signal, indicative of whether predetermined air gaps have been exceeded, such as air gaps corresponding to magnetic fie strengths of 16 Gauss peak-to-peak (i.e., Gpp), 28 Gpp, and 60 Gpp, respectively. The decoder 22 includes three decoder portions, decoder portions 90, 92 and 94.

Considering illustrative decoder portion 90 (FIG. 5A), the counter outputs Q0N 20a, Q1N 20b, and Q2N 20c are coupled to an NOR gate 96, as shown. The output of NOR gate 96 is coupled to an RS flip-flop 98, which is reset by the output of an OR gate 100 having as inputs the POSCOMPN_DELAY signal 56 and STARTUP signal 62. With this arrangement, the flip-flop 98 is reset at startup and after each peak of the DIFF signal to be ready for the next cycle. The QN output of flip-flop 98 provides a CHK_LIM signal 102 coupled to an OR gate 104. The output of OR gate 104 is coupled to a flip-flop 106 which generates at its Q output the BLIMIT signal 24a. A logic high BLIMIT signal indicates that the respective airgap, here corresponding to a signal level of 16 Gauss peak-to-peak, has been exceeded (i.e., the BLIMIT signal 24a goes high when e field is less than 16 Gpp).

Figure 7:
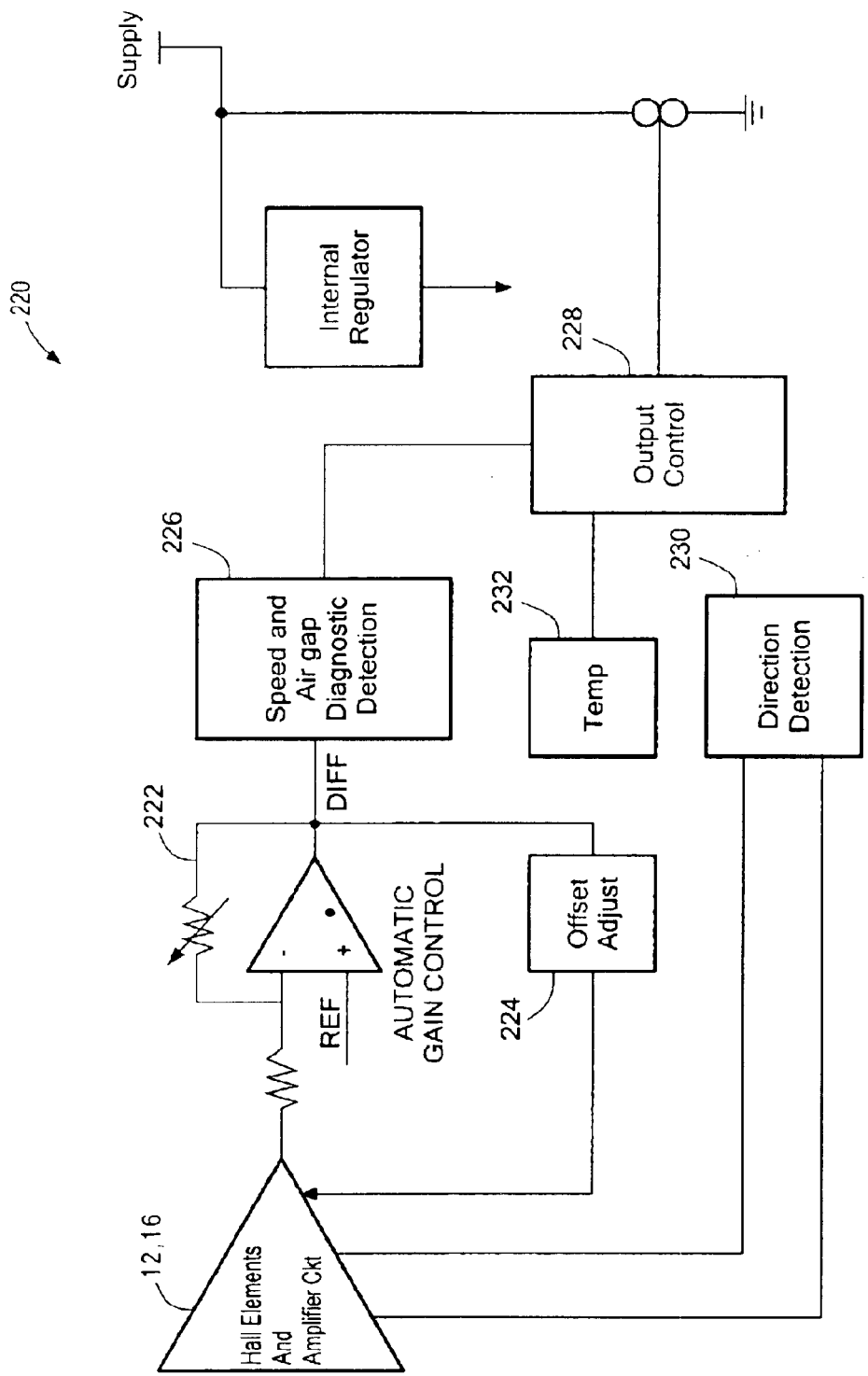
FIG. 7 is a block diagram of a gear tooth sensor that employs the Hall effect sensor of FIG. 1.

Here, the flip-flop 106 is reset at startup by the STARTUP signal 62 and also by a PULSE1 signal 108 via NOR gate 110. The PULSE1 signal 108 is specific to a gear tooth sensor application for the peak-to-peak detector 14 as shown in FIG. 7 and described below.

The other two decoder portions 92 and 94 (FIG. 5B) are substantially identical to portion 90, containing NOR gates 112 and 114 like NOR gate 96, flip-flops 116 and 118 like flip-flop 98, OR gates 120 and 122 like OR gate 104, and flip-flops 124 and 126 like flip-flop 106. The NOR gate 112 receives counter output Q4N signal 20e and NOR gate 114 receives counter outputs Q0N signal 20a, Q3N signal 20c and Q5N signal 20f. Decoder portions 92 and 94 differ from portion 90 in the addition of NOR gates 128 and 130, as well as inverters 132 and 134, respective, to address circuit operation with automatic gain control (AGC) as discussed below.

In the illustrative embodiment, the POSCOMPN_DELAY signal 56 is delayed by approximately 2 $\mu$s in order to keep the CHK_LIM signal 102 intact while the flip-flop 106 is clocked. Thus, the second counter 60 is reset at startup of the circuit 10 and at each positive transition of the POSCOMPN_DELAY signal 56. As noted above, the second counter 60 is held in reset while the POSCOMPN_DELAY signal 56 is high and is released to permit counting upon each negative transition of the POSCOMPN_DELAY signal 56.

In operation, the BLIMIT, BTHRESH, and BINISTALL signals are all initialized to logic state zero at startup and at PULSE1 108, which assumes that the DIFF signal 18 is greater than the BLIMIT threshold, the BTHRESH threshold and the BINSTALL threshold (i.e., that the respective air gaps are not exceeded). The outputs of flip-flops 98, 116 and 118 (i.e., the CHK_LIM signal 102, a CHK_THRESH signal 136 and a CHK_INSTALL signal 138) in each decoder section are reset high after every positive peak of the DIFF signal 18, which means that the BLIMIT, BTHRESH, and BINSTALL signals will remain low unless forced high on any cycle of DIFF. If the second counter 60 counts up to 7, this forces the CHK_LIM signal 102 in the decoder section 90 low and, when the POSCOMPN signal 48 next goes high, it clocks a low state into the flip-flop 106. This causes the BLIMIT signal 24a to stay low, thereby indicating that the DIFF signal 18 is greater than 16 G peak-to-peak. If any peak of the DIFF signal 18 is less than 16 Gpp (meaning that the count value at the output of counter 60 is less than 7), then the CHK_LIM signal 102 does not go low before its value is clocked into flip-flop 106, and BLIMIT signal 24a goes high. Further, BLIMIT signal 24a will stay high until the PULSE1 108 resets the flip-flop 106. After the flip-flop 106 is clocked by the POSCOMPN signal 48, the CHK_LIM signal 102 at the output of flip-flop 98 is reset high by the POSCOMPN_DELAY signal 56.

Referring back to FIGS. 5A–5B, in conjunction with FIG. 3 and FIG. 4, the PEAK_LSB signal 58 stops transitioning starting at time t1 and continuing until the POSCOMPN signal 48 transitions to a high level, since the hold input 50 to the first counter 32 is asserted during that time. As is apparent, once the POSCOMPN signal 48 transitions to either a high or a low level, several fast pulses occur on PEAK_LSB signal 58 and the C2_CLK 68, since the DAC output signal 44 is dropping by the 100 mV of hysteresis almost instantaneously (i.e., as fist as the 2 MHz CLK oscillator clock input to first counter 32 allows).

Since the second counter 60 is reset by the POSCOMPN_DELAY signal 56, and specifically is reset for the interval when the POSCOMPN_DELAY signal 56 is high, these fast C2_CLK pulses occurring when the POSCOMPN signal 48 transitions to a logic low level are not counted by second counter 60 and could represent an inaccuracy in the resulting peak-to-peak signal value as read at the output of the second counter 60 at time t2. Although the second counter 60 counts the fast C2_CLK pulses occurring a short time before time t2, the decoder 22 stops looking at the counter's output when it gets clocked on the rising edge of the POSCOMPN signal 48 and therefore, counting these fast pulses does not prevent this possible inaccuracy. In the illustrative embodiment, this possible inaccuracy is prevented in the decoder 22 by subtracting the 100 mV of hysteresis from the peak-to-peak DIFF signal 18 when computing the corresponding count value of the second counter 60.

An alternative way to correct for this inaccuracy is to modify the POSCOMPN_DELAY signal 56 so that it is delayed with respect to the POSCOMPN signal 48 only on rising edges. With this arrangement, the counter 60 would be reset at the same time that the POSCOMPN signal 48 goes low, thereby permitting these fast C2_CLK pulses just before time t0 to be counted by the second counter 60 before the flip-flop 106 is clocked when the POSCOMPN signal 48 goes high. Therefore a true representation of the peak-to-peak value will exist at the output of second counter 60 when the QN output of latch 98 is clocked into flip-flop 106.

The digital word 20 at the output of the second counter 60 represents the number of C2_CLK edges that have clocked the second counter 60. The peak-to-peak DIFF voltage can be determined by simply multiplying the second counter 60 output value 20 by the step size in volts associated with each count of the second counter 60. For example, if the second counter 60 output value is thirteen and each step of the second counter 60 corresponds to an 18 mV step in the DAC voltage, then the DIFF signal is 234 mV peak-to-peak. Further, in the magnetic field application of the illustrated embodiment, the peak-to-peak DIFF signal voltage can be converted to Gauss by dividing the value of the peak-to-peak DIFF signal voltage by the amplifier gain in mV/Gauss. For example, if the gain is 14 mV/Gauss then, in the above example, the DIFF signal voltage of 234 mVpp is generated by a magnetic field of (234 mVpp)/(14 mV/G) or 16.7 Gpp, assuming that the possible inaccuracy described above is prevented, such as by modifying the POSCOMPN_DELAY signal 56 to be delayed with respect to the POSCOMP signal 48 only on the rising edges.

Air gap is inversely related to magnetic field strength. In the illustrative embodiment, BLIMIT signal 24a is high when a maximum airgap is exceeded as is indicated by signal levels of less than 16 Gpp, the BTHRESH signal 24b is high when the maximum air gap limit is being approached as is indicated by signal levels of less than 28 Gpp, and the BINSTALL signal 24c is high when the airgap is within a nominal operating range as is indicated by signal levels of less than 60 Gpp. Given a gain of 14 mV/G and a step value associated with each count in the second counter 60 of 18 mV/step, the BLIMIT threshold of 16 Gpp is exceeded by a DIFF signal value of (16 Gpp)(14 mV/G)=224 mVpp and this DIFF signal value corresponds to an output value of counter 60 of (224 mV−100 mV)/(18 mV/step)=6.9 or rounding up, a count of 7. The BTHRESH threshold of 28 Gpp is exceeded by a DIFF signal value of (28 Gpp)(14 mV/G)=392 mVpp and this DIFF signal value corresponds to a count value at the output of counter 60 of (392 mV−100 mV)/(18 mV/step)=16.2, or rounding down, a count of 16. Likewise the BINSTALL threshold of 60 Gpp is exceeded by a DIFF signal value of (60 Gpp)(14 mV/G)=840 mV and this DIFF signal value corresponds to a count value at the output of counter 60 of (840 mV−100 mV)/(18 mV/step)= 41.1, or rounding down, a count of 41. Note that the 100 mV subtracted from the peak-to-peak DIFF signal value is the hysteresis of second comparator 36 (FIG. 2) since the C2_CLK pulses are not counted during the delay interval occurring just prior to time t0. As will be appreciated, if the POSCOMPN_DELAY signal 56 were modified as described above, to be delayed with respect to the POSCOMPN signal 48 on rising edges only, then the 100 mV hysteresis need not be subtracted from the DIFF signal value when computing the corresponding count values as above.

The Hall effect sensor 10 of the illustrated embodiment implements AGC in the amplifier 16 (FIG. 1), whereby the gain in mV/G can change. This feature can impact operation of the peak-to-peak detector 14 since a particular output 20 of the second counter 60 which corresponded to one predetermined Gauss level prior to the AGC being activated, will correspond to a different Gauss level after the AGC is activated. For example, given a value of the BINSTALL signal 24c of 60 Gpp and assuming that the maximum gain of the amplifier 16 is 14 mV/G, the peak-to-peak DIFF voltage which would cause the BINSTALL threshold to be exceeded is (60 G)(14 mV/G) or 840 mV. However, in the illustrative embodiment, if the signal is 61 Gpp, and if a 61 Gpp should cause AGC to be activated, the gain will drop to about 10 mV/G and thus, a peak-to-peak DIFF voltage of (61 G)(10 mV/G), or 610 mV will cause the BINSTALL threshold to be exceeded (i.e., the BINSTALL signal 24c will go to a logic one state).

This potential problem is handled relatively simply in the illustrative embodiment due to the particular AGC scheme implemented. According to the AGC operation, the amplifier 16 is at a maximum gain until the ambient magnetic field reaches a level of 60 Gpp and is then at a reduced gain for signal levels greater than 60 Gpp. Since 60 Gauss corresponds to the BINSTALL threshold level, if AGC is activated, then it is known that the BINSTALL signal 24c should be low, indicating that the airgap is less than the nominal operating range, making the peak-to-peak value greater than the BINSTALL threshold. In the circuit of FIGS. 5A–5B, the BINSTALL signal 24c is forced low when AGC is activated, since this is the known state when the peak-to-peak signal is greater than 60 Gpp and since otherwise, by operation of AGC, the BINSTALL signal 24c incorrectly may be caused to go high. Also, the BTHRESH signal 24b is forced low when AGC is activated since the BTHRESH signal 24b should also be low when the peak-to-peak signal is at 60 Gauss and AGC operation could cause the BTHRESH signal 24b to be high incorrectly. The BLIMIT signal 24a is not forced low in this manner since at 61 Gpp the DIFF signal will be so high in millivolts, even when AGC is activated, that the BLIMIT signal 24a will not be caused to go high incorrectly.

This operation of forcing the BINSTALL and BTHRESH signals low is achieved by the NOR gates 128 and 130 of decoder portions 92 and 94, respectively. Input AGC_CNT0N signal 140 is high when AGC is activated (i.e., when the gain is no longer at maximum). Thus, whenever AGC is activated and the AGC_CNT0N signal 140 is high, the BTHRESH signal 24b is forced low. Likewise, when AGC is activated, the BINSTALL signal 24c is forced low.

Thus, the decoder 22 deals with AGC gain changes by forcing both of the BINSTALL and the BTHRESH signals low when AGC is activated. This solution is acceptable for AGC gain changes in the case described above—that is, the case where AGC is triggered only when the peak-to-peak value is greater than the BINSTALL threshold. In this particular case, it is known that the Gauss levels associated with BLIMIT, BTHRESH and BINSTALL have been exceeded when AGC is triggered. Also, the circuit 10 starts in maximum gain and any AGC events result in a decrease in the gain of the circuit 10.

Figure 6A:
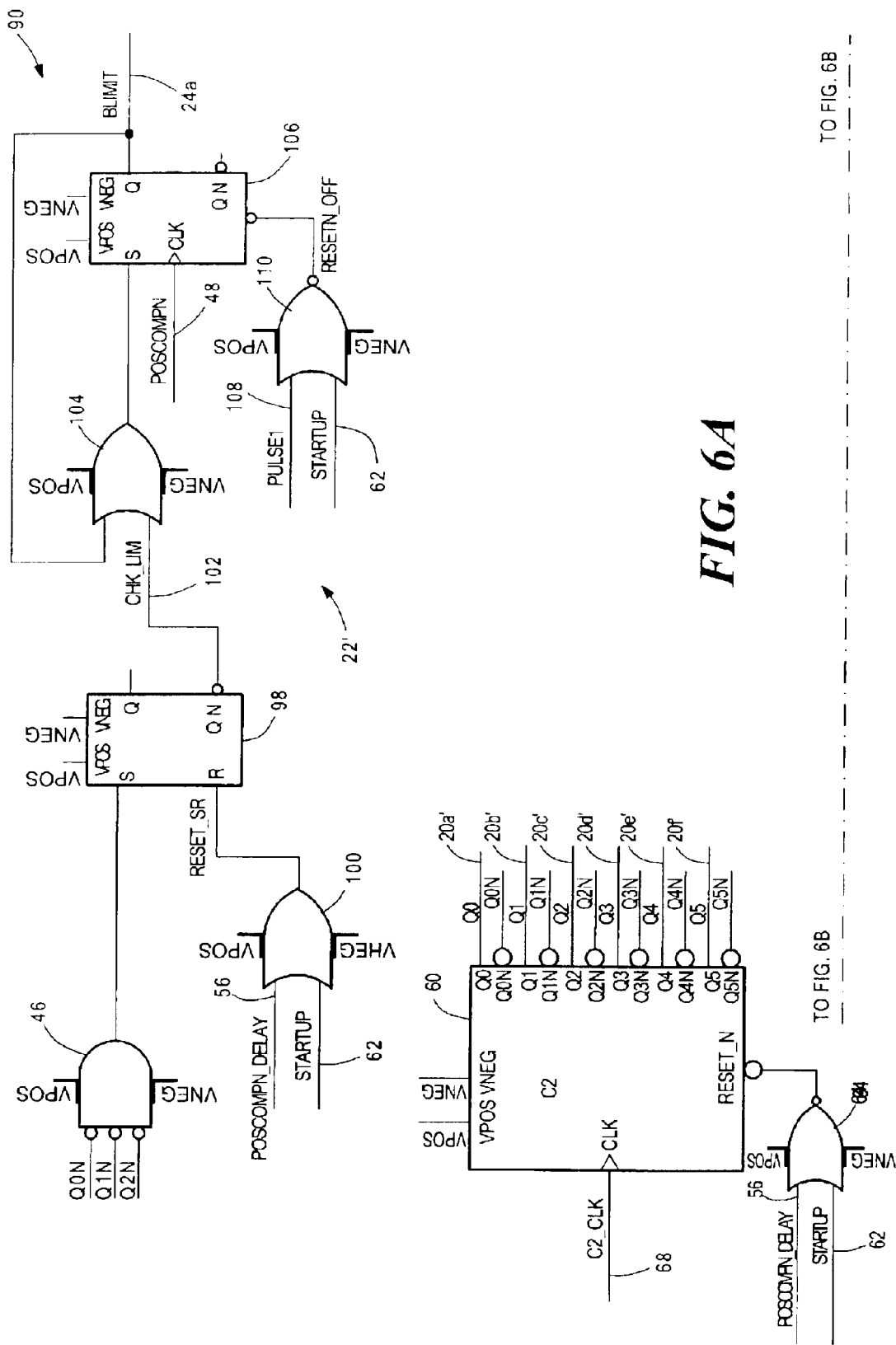
FIGS. 6A–6C are schematic diagrams of an alternative embodiment of the portion of the Hall effect sensor shown in FIG. 5A.
Figure 6B:
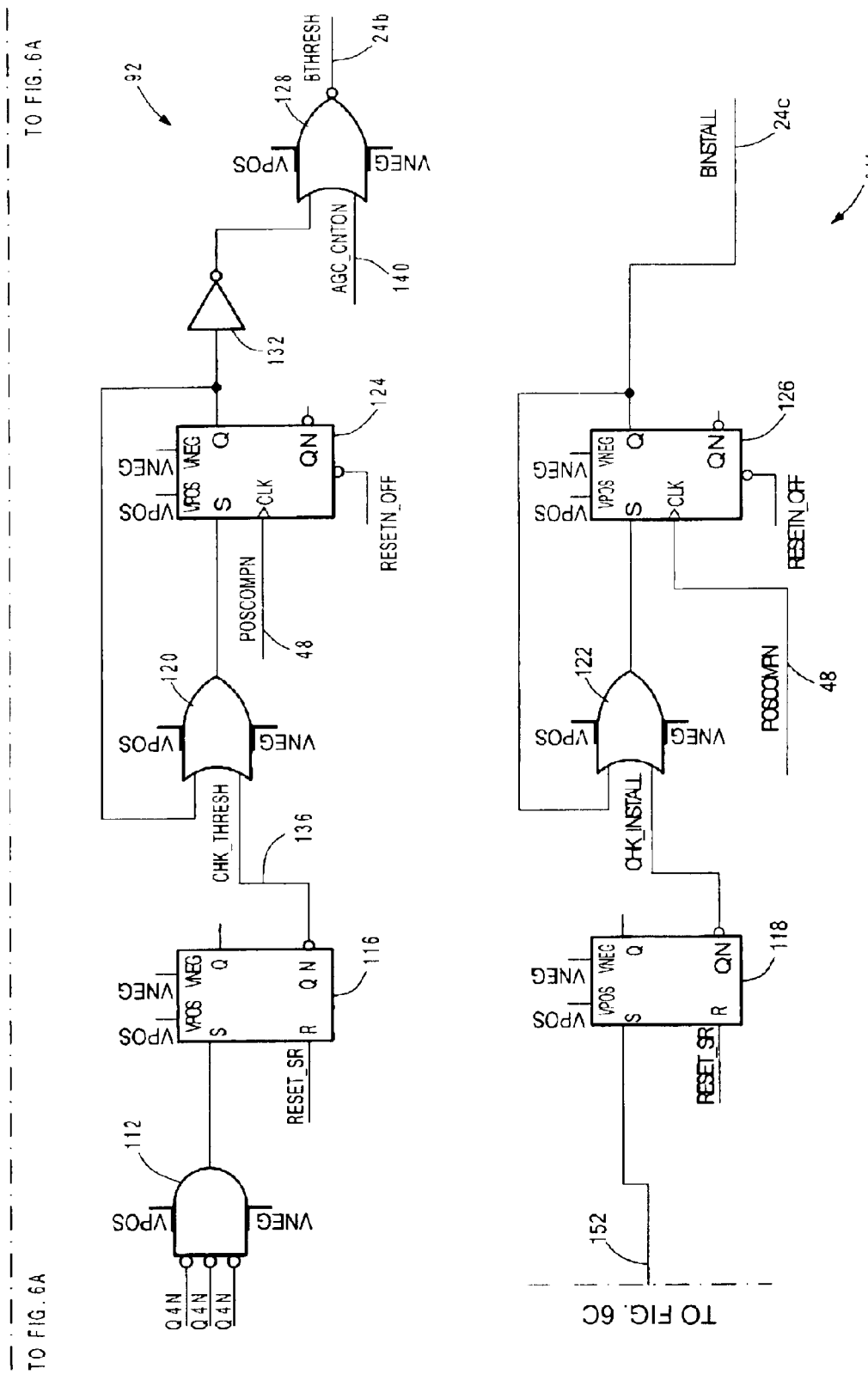

Another way of handling the AGC gain change is to use a decoder that responds to the AGC gain of amplifier 16. Thus, and referring to FIGS. 6A–6C, an alternative embodiment of the decoder 22, indicated as decoder 22', includes decoder portions 90, 92 and 94'. The decoder portion 94' includes an AGC decoder 150. In the illustrative embodiment, the AGC decoder 150 effectively adjusts the count level of the counter 60 that sets SR latch 118. The count level is adjusted so that the BINSTALL level of the circuit is maintained at approximately 60 Gpp even when the AGC gain changes. The decoding of decoder 150 increases the robustness of the peak-to-peak detection in cases where an AGC event can occur before the DIFF signal reaches a signal level that is greater than the BINSTALL threshold.

For the case of the BINSTALL threshold equal to 60 Gpp, when AGC is activated, the gain changes from 14 mV/G to 10 mV/G. Without compensating for this new AGC gain level the BINSTALL signal 24c trips at a peak-to-peak signal of 840 mV ((41.1 counter steps*18 mV/step)+100 mV hysteresis). At 10 mV/G an 840 mV trip point corresponds to 84 G. Thus, the threshold at which the BINSTALL signal 24c is generated is now 84 G instead of 60 G.

The use of the smart decoding of the decoder 150 solves this problem. For each AGC gain level in the system the number of steps for counter 60 that correspond, in the case of BINSTALL, to 60 Gpp, is determined. Assuming a gain of 10 mV/G and a counter step size of 18 mV/step, a 60 Gpp signal would correspond to a DIFF signal with an amplitude equal to (60 Gpp)*(10 mV/G)=600 mVpp. Therefore, the output count of counter 60 that corresponds to a 60 Gpp signal would be (600 mV−100 mV hysteresis)/(18 mV/step)=27.8 or rounding up, a count of 28.

To make the peak detecting mechanism independent of AGC gain, therefore, logic in the AGC decoder 150 alters the number of steps required to set SR latch 118 when the system gain is at all of the possible AGC gain levels. For the 10 mV/G level, the AGC decoder 150 sets the SR latch 118 when the counter 60 has counted up by 28 steps.

The decoder portion 94' differs from the decoder portion 94 (from FIG. 5B) in the following ways. First, the decoder 150 replaces the NOR gate 114 (of decoder portion 94) at the set terminal (S) of the SR latch 118. That is, in decoder 22', an output of the AGC decoder 150, AGC decoder output signal 152, is connected to the set terminal (S) of SR latch 118. Also, because the NOR gate 130 and the inverter 134 (of decoder portion 94) are not needed in the decoder portion 94', the output of the flip-flop 126 is the BINSTALL signal 24c.

Figure 6C:
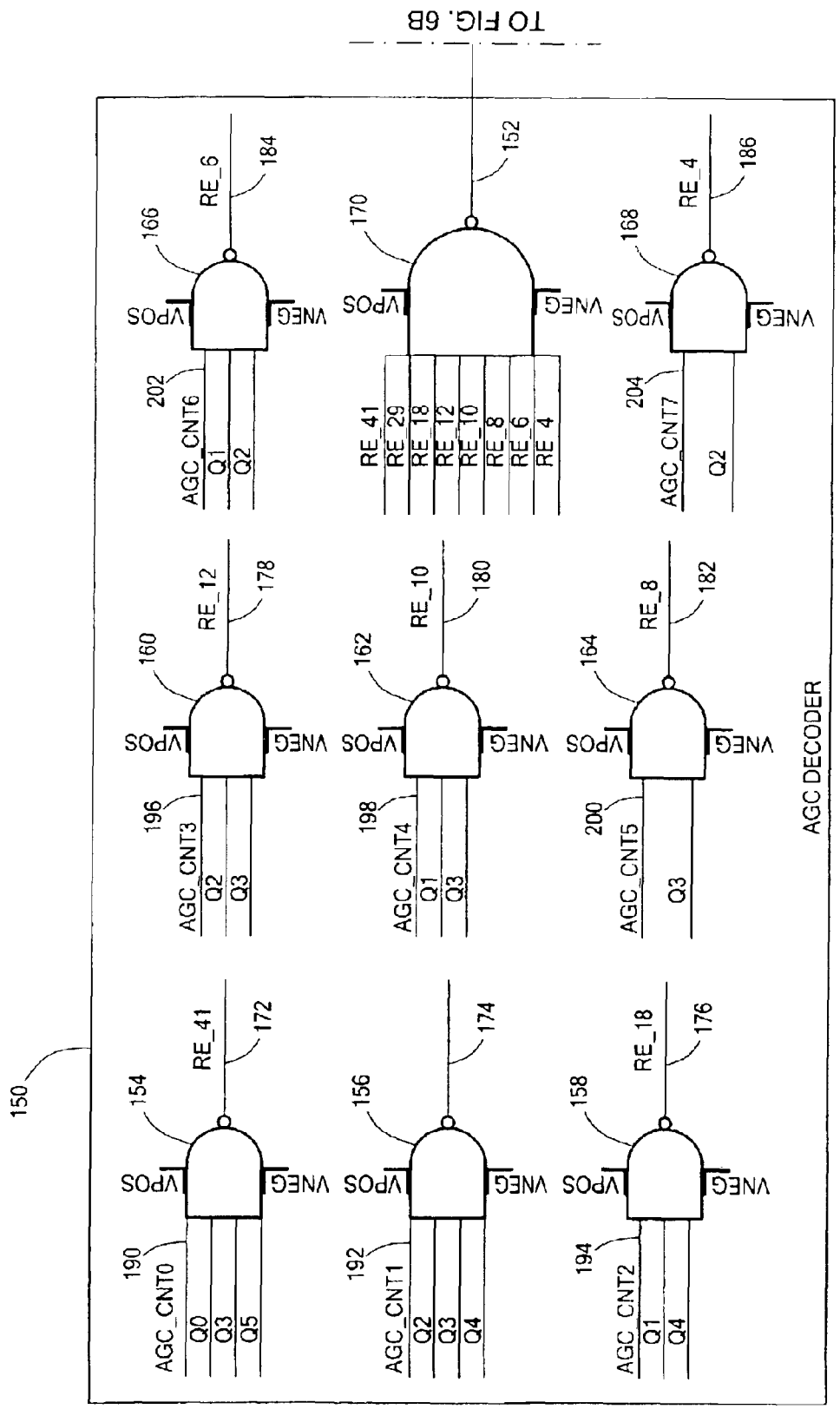

In the embodiment shown in FIG. 6C, the AGC decoder 150 includes nine NAND gates, NAND gates 154, 156, 158, 160, 162, 164, 166, 168 and 170. Because amplifier 16 AGC circuitry (not shown) supports eight AGC gain values, the AGC circuitry includes a 3-bit counter to produce an AGC value for each possible gain value, that is, count values AGC_CNT0 through AGC_CNT7. The output from NAND gate 170 is the AGC decoder output signal 152. The NAND gate 170 receives as its inputs the outputs of the eight other NAND gates, that is, outputs 172, 174, 176, 178, 180, 182, 184 and 186, from NAND gates 154, 156, 158, 160, 162, 164, 166 and 168, respectively. Each of these eight NAND gates receives as an input a signal corresponding to a different one of the AGC count values. That is, NAND gates 154, 156, 158, 160, 162, 164, 166 and 168 receive as input AGC_CNT0 signal 190, AGC_CNT1 signal 192, AGC_CNT2 signal 194, AGC_CNT3 signal 196, AGC_CNT4 signal 198, AGC_CNT5 signal 200, AGC_CNT6 signal 202 and AGC_CNT7 signal 204, respectively. The AGC_CNT0—AGC_CNT7 signals, produced by the AGC circuitry, correspond to the eight possible AGC count (gain) values. The AGC decoder output signal 152 transitions to a logic high state whenever any of the 8 scenarios decoded by the 8 other NAND gates in the AGC decoder 150 are true (that is, corresponds to a logic low value as the output of the NAND gate representing the true scenario).

For example, before an AGC event occurs the AGC_CNT0 signal 190 is a logic high and all other AGC_CNT signals are a logic low. The AGC activates once the AGC_CNT0 signal 190 transitions to a logic low state and the AGC_CNT1 signal 192 transitions to a logic high state. All other AGC_CNT signals remain a logic low.

Consider the case where the AGC gain is 14 mV/G and AGC_CNT0 signal 190 is in the logic high state. In this case the only NAND gate in the decoder 150 (other than NAND gate 170) that can have a logic low output is NAND gate 154. This NAND gate is the only NAND gate that has the AGC_CNT0 signal as one of its input signals. All other AGC_CNT signals are a logic low. It is noted that the other inputs for NAND gate 154 are the non-inverted counter output signals, output signal 20a', output signal 20d' and output signal 20f' (which correspond to Q0, Q3 and Q5, respectively). The NAND gate 154 decodes the case where the AGC gain is 14 mV/G and the counter 60 is at count 41. When all of the inputs to the NAND gate 154 are a logic high, the output 172 is a logic low and the output of the NAND gate 170 is a logic high. This condition sets the SR latch 118.

When the AGC_CNT1 signal 192 is a logic high, the only NAND gate (other than the NAND gate 170) that can have a logic low output is NAND gate 156. This NAND gate is the NAND gate that has the AGC_CNT1 signal as one of its input signals. The output of NAND gate 156, output 174 (signal RE_29) only goes high when AGC_CNT1 is high and when counter 60 outputs 20c' (Q2), 20d' (Q3) and 20e' (Q4) are all logic high. When all of the inputs to the NAND gate 156 are high the SR latch 118 is set. So, the SR latch 118 is set when counter 60 is at count 28—the count that corresponds to a BINSTALL level of 60 Gpp when the AGC gain level is 10 mV/G.

The rest of the decoder 150 is designed to operate in a similar fashion with respect to the six other AGC count values. Therefore, the AGC decoder 150 decodes the required counter 60 count that corresponds to a BINSTALL level of 60 Gpp for the 8 possible AGC gain steps. Consequently, the BINSTALL signal trips at approximately 60 Gpp for all 8 AGC gains associated with the described embodiment.

Although only one AGC decoder, in particular, an AGC decoder to decode the BINSTALL signal, is shown, it will be understood that a similar AGC decoder for the BLIMIT and BTHRESH signals could be included in the decoder 22' if so desired.

Now referring to FIG. 7, an illustrative application for the Hall effect sensor 10 including peak-to-peak detector 14 is shown in the form of a gear tooth sensor 220. The sensor 220 includes Hall device 12 and amplifier 16, as well as a separate AGC circuit 222 and an offset adjustment circuit 224. The peak-to-peak detector 14 is provided in a speed and air gap diagnostic detector 226, which thus provides diagnostic output signals 24a–24c to an output control circuit 228. Also provided to the output control circuit 228 is direction information from a direction detection circuit 230 and temperature information from a temperature circuit 232.

Referring to FIG. 7 together with FIG. 5, the output control circuit 228 provides the collected diagnostic information in the form of a predefined sequence of data bits or data stream and may be used to generate the PULSE1 signal 108. The data bits provide diagnostic information about a rotating gear, such as speed, direction of rotation, and other diagnostic information. In this case, it is desirable to hold the state of the BLIMIT signal 24a until the entire sequence of data bits is generated. Thus, if the BLIMIT signal 24a goes high, it is latched until the PULSE1 signal 108 resets the flip-flop 166.

Having described the preferred embodiments of the invention, it will now become apparent to one of ordinary skill in the art that other embodiments incorporating their concepts may be used. It will be appreciated by those of ordinary skill in the art that other applications for the peak-to-peak detector 14 beyond the Hall effect sensor 10 are possible.

It is felt therefore that these embodiments should not be limited to disclosed embodiments but rather should be limited only by the spirit and scope of the appended claims. All publications and references cited herein are expressly incorporated herein by reference in their entirety.

What is claimed is:

1. A detector for determining the peak-to-peak value of a signal comprising:

a first circuit to provide a tracking signal that tracks a positive slope of the signal during a first time interval and a negative slope of the signal during a second time interval; and a second circuit comprising a counter configured to produce binary count values associated with the tracking signal provided during one of the first and second time intervals, wherein one of the values is indicative of the peak-to-peak value of the signal.

2. The detector of claim 1 wherein the second circuit is configured to produce values associated with the tracking signal provided during the other of the first and second time intervals, wherein one of the values associated with the tracking signal provided during the other of the first and second time intervals is also indicative of the peak-to-peak value of the signal.

3. The detector of claim 1 wherein the first circuit comprises:

a track and hold circuit to provide the tracking signal, the tracking signal holding the value of the signal at peaks and valleys of the signal until the signal varies from the held peaks and valleys by a predetermined amount; and a circuit to provide an output signal which changes state after the signal varies from the tracking signal by the predetermined amount.

4. The detector of claim 3 wherein the counter is responsive to the circuit to count between changes in state of the output signal, wherein the output signal of the counter occurring at one of the changes in state of the output signal is indicative of the peek-to-peak value of the signal.

5. The detector of claim 3 wherein the circuit comprises a comparator having a hysteresis value by which the predetermined amount is established.

6. The detector of claim 3 wherein the circuit comprises a comparator circuit that includes a comparator to provide the output signal which changes state when the signal varies from the tracking signal by the predetermined amount, and wherein the first circuit further comprises:

a delay circuit coupled to the comparator circuit to provide a delayed signal that is a delayed version of the output signal.

7. The detector of claim 6 wherein the counter, reset in response to the delayed signal, is operative to count between changes in the state of the delayed signal, wherein the output signal of the counter occurring at one of the changes in state of the delayed signal is indicative of the peak-to-peak value of the signal.

8. The detector of claim 7 wherein the delay between the output signal and the delayed signal is selected according to use by external decoding logic of the value indicative of the peak-to-peak value of the signal.

9. A method of determining the peak-to-peak value of a signal comprising:

providing a tracking signal that tracks a positive slope of the signal during a first time interval and a negative slope of the signal during a second time interval; and producing binary count values associated with the tracking signal by counting during one of the first and second time intervals, one of the values being indicative of the peak-to-peak value of the signal.

10. The method of claim 9 wherein the tracking signal holds the value of the signal at peaks and valleys of the signal until the signal varies from the held peaks and valleys by a predetermined amount, and wherein the method further comprises:

providing an output signal which changes state after the signal varies from the tracking signal by the predetermined amount.

11. The method of claim 10 wherein producing values comprises:

counting between changes in state of the output signal, wherein the output signal of the counter occurring at one of the changes in state of the output signal is indicative of the peak-to-peak value of the signal.

12. A detector for determining the peak-to-peak value of a signal comprising:

a first circuit to provide a tracking signal that tracks a positive slope of the signal during a first time interval and a negative slope of the signal during a second time interval, wherein the first circuit comprises:

a track and hold circuit to provide the tracking signal, the tracking signal holding the value of the signal at peaks and valleys of the signal until the signal varies from the held peaks and valleys by a predetermined amount;

a circuit to provide an output signal which changes state after to signal varies from the tracking signal by the predetermined a mount; and a delay circuit coupled to the circuit to provide a delayed signal that is a delayed version of the output signal; and a second circuit configured to produce values associated with the tracking signal provided during one of the first and second time intervals, wherein one of the values is indicative of the peak-to-peak value of the signal, wherein the second circuit comprises a counter, reset in response to the delayed signal, to count between changes in the state of the delayed signal, wherein the output signal of the counter occurring at one of the changes in state of the delayed signal is indicative of the peak-to-peak value of the signal, and wherein the delay between the output signal and the delayed signal is selected according to use by external decoding logic of the value indicative of the peak-to-peak value of the signal.

* * * * *

UNITED STATES PATENT AND TRADEMARK OFFICE
CERTIFICATE OF CORRECTION

PATENT NO. : 6,919,720 B2
DATED : July 19, 2005
INVENTOR(S) : Ravi Vig et al.

It is certified that error appears in the above-identified patent and that said Letters Patent is hereby corrected as shown below:

Column 5,
Line 24, reads "fie" and should read -- field --.
Line 42, reads "e" and should read -- the --.

Column 6,
Line 41, reads "fist" and should read -- fast --.

Column 12,
Line 39, reads "after to signal" and should read -- after the signal --.
Line 40, reads "a mount" and should read -- amount --.

Signed and Sealed this

Third Day of January, 2006

JON W. DUDAS
*Director of the United States Patent and Trademark Office*